(12) United States Patent
Iwamoto et al.

(10) Patent No.: US 10,529,623 B2
(45) Date of Patent: Jan. 7, 2020

(54) METHOD OF MANUFACTURING LIGHT EMITTING ELEMENT

(71) Applicant: NICHIA CORPORATION, Anan-shi, Tokushima (JP)

(72) Inventors: Shuichi Iwamoto, Tokushima (JP); Shohei Sadamoto, Tokushima (JP); Shinya Mitsuhashi, Anan (JP)

(73) Assignee: NICHIA CORPORATION, Tokushima (JP)

( * ) Notice: Subject to any disclaimer, the term of this patent is extended or adjusted under 35 U.S.C. 154(b) by 0 days.

(21) Appl. No.: 16/146,841

(22) Filed: Sep. 28, 2018

(65) Prior Publication Data

US 2019/0103315 A1 Apr. 4, 2019

(30) Foreign Application Priority Data

Sep. 29, 2017 (JP) ................. 2017-192030

(51) Int. Cl.
*H01L 21/78* (2006.01)
*H01L 33/48* (2010.01)
*H01L 21/683* (2006.01)

(52) U.S. Cl.
CPC .......... *H01L 21/78* (2013.01); *H01L 21/6836* (2013.01); *H01L 33/48* (2013.01); *H01L 2933/0033* (2013.01)

(58) Field of Classification Search
None
See application file for complete search history.

(56) References Cited

U.S. PATENT DOCUMENTS

| 8,969,177 B2* | 3/2015 | Chowdhury | ............ H01L 21/78 438/464 |
| 2001/0014492 A1* | 8/2001 | Noguchi | ............ H01L 21/6836 438/118 |
| 2010/0267219 A1* | 10/2010 | Kajiyama | .......... B23K 26/0853 438/462 |
| 2015/0348821 A1* | 12/2015 | Iwanaga | ................ H01L 21/78 257/798 |

FOREIGN PATENT DOCUMENTS

| JP | 2002-141309 A | 5/2002 |
| JP | 2002-367934 A | 10/2002 |
| JP | 2015-183162 A | 10/2015 |

* cited by examiner

*Primary Examiner* — Angel Roman
(74) *Attorney, Agent, or Firm* — Birch, Stewart, Kolasch & Birch LLP

(57) ABSTRACT

The method of manufacturing a light emitting element includes: temporarily fixing a semiconductor layer of a wafer including a base member and the semiconductor layer to a support base member by a double-sided tape having a loss tangent adapted to be increased by heating from an ordinary temperature; forming a cleavage starting portion for dividing the wafer into a plurality of light emitting elements at an ordinary temperature in the wafer; and singulating the wafer into a plurality of light emitting elements on the support base member while the double-sided tape is heated.

20 Claims, 7 Drawing Sheets

METHOD OF MANUFACTURING LIGHT EMITTING ELEMENT

This application claims priority to Japanese Patent Application No. 2017-192030, filed on Sep. 29, 2017, the disclosures of which are hereby incorporated by reference in their entireties.

BACKGROUND

1. Technical Field

The present disclosure relates to a method of manufacturing a light emitting element.

2. Description of Related Art

In a method of manufacturing a light emitting element, a cleavage preparing step of forming a cleavage starting portion and a cleaving step of cleaving a wafer by pressing the cleavage starting portion with a pressing member are carried out to obtain a plurality of chips from a single wafer.

In a conventional cleavage preparing step and cleaving step, a wafer is supported on a dicing sheet (see JP 2002-141309 A).

SUMMARY

In a conventional method, if unexpected chipping or breakage occurs in a manufacturing process, time and labor is taken for coping with such chipping or breakage, and thus improvement in work efficiency is desired.

One embodiment of the present invention has been made in view of the above-described situations, and one object of the embodiment is to provide a method of manufacturing a light emitting element with which work efficiency can be improved.

A method of manufacturing a light emitting element according to an embodiment of the present disclosure includes: temporarily fixing a semiconductor layer of a wafer including a base member and the semiconductor layer to a support base member by a double-sided tape having a loss tangent adapted to be increased by heating from an ordinary temperature; forming a cleavage starting portion for dividing the wafer into a plurality of light emitting elements at an ordinary temperature in the wafer; and singulating the wafer into a plurality of light emitting elements on the support base member while the double-sided tape is heated.

A method of manufacturing a light emitting element according to certain embodiments of the present invention allows for improving work efficiency.

DETAILED DESCRIPTION OF EMBODIMENTS

Embodiments

Figure 1A:
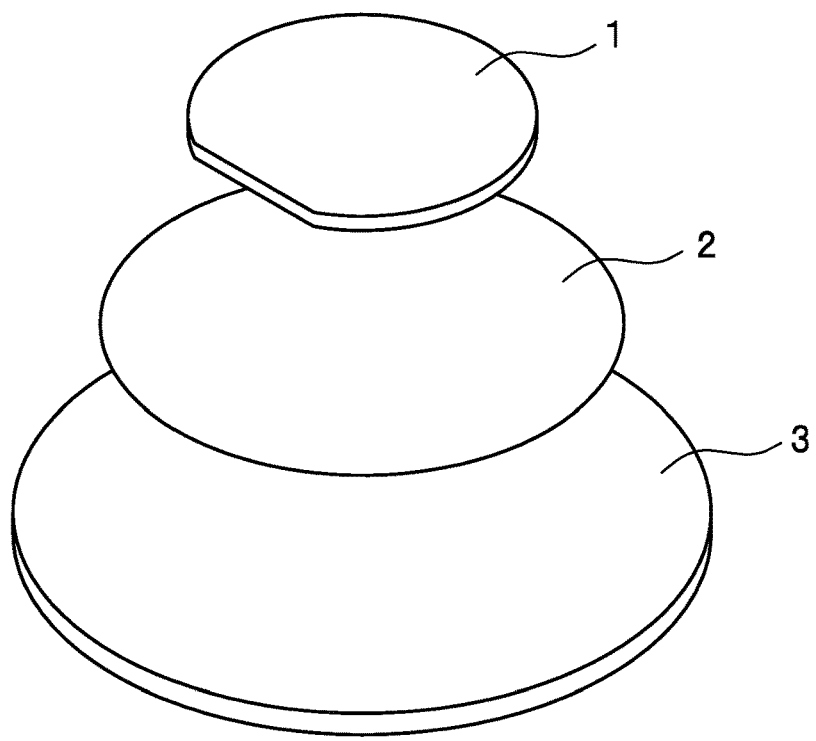
FIG. 1A is a schematic perspective view showing an operation of temporarily fixing a wafer to a support base member in a method of manufacturing a light emitting element according to an embodiment.

Certain embodiments of the present invention will be described below with reference to the drawings. The embodiments shown below are intended to illustrate a method of manufacturing a light emitting element for giving a concrete form to the technical idea of the present disclosure, and the scope of the present invention is not limited to the following embodiments. Sizes, materials, shapes and relative arrangements of components described in embodiments are not intended to limit the scope of the present invention thereto unless otherwise specified, and are illustrative. Sizes, positional relationships and so on of members shown in the drawings may be exaggerated for ease of explanation. In the description below, the same or similar names and numerals denote the same or similar members, and detailed descriptions thereof may be appropriately omitted.

Method of Manufacturing Light Emitting Element

First Embodiment

As shown in FIGS. 1A to 5, a method of manufacturing a light emitting element includes: temporarily fixing a wafer 1 to a support base member 3 (temporarily fixing step S101); forming a cleavage starting portion 11 on the wafer 1 (cleavage starting portion forming step S102); dividing the wafer 1 into a plurality of light emitting elements 4 (dividing step S103); peeling off a plurality of light emitting elements 4 and a double-sided tape 2 from the support base member 3 (support base member separating step S104); and peeling off a plurality of light emitting elements 4 from the double-sided tape 2 (light emitting element peeling step S105).

Hereinafter, the steps will be described.

Temporarily Fixing

Figure 1B:
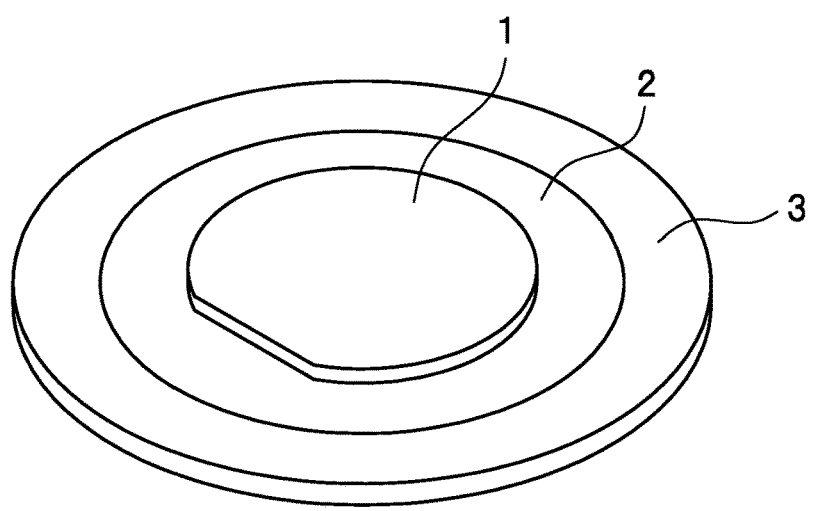
FIG. 1B is a schematic perspective view showing an operation of temporarily fixing a wafer to a support base member in a method of manufacturing a light emitting element according to an embodiment.

In the temporarily fixing step S101, a semiconductor layer of the wafer 1, which includes a base member and the semiconductor layer, is temporarily fixed to the support base member 3 by the double-sided tape 2, which is adapted to increase loss tangent by heating from an ordinary temperature, as shown in FIGS. 1A and 1B.

Any appropriate wafer may be used for the wafer 1, and a known wafer can be used for the wafer 1. Examples of the wafer 1 include a wafer in which GaN-based semiconductors are layered on a sapphire base member and a plurality of light emitting element portions are arranged in longitudinal and lateral directions of the sapphire base member.

For the double-sided tape 2, a double-sided tape having a loss tangent adapted to be increased by heating from an ordinary temperature, is used. As used herein, the expression "loss tangent adapted to be increased by heating from an ordinary temperature" refers to that, by heating from an ordinary temperature, the tape (composed of a polymer material) exhibits deformation behavior in which viscosity is dominant over elasticity. More specifically, the expression "loss tangent adapted to be increased" as used herein refers to that the loss tangent is 0.3 or more. The temperature in heating is, for example, in a range of 40° C. to 80° C.

When a sufficient displacement is not given to the double-bonded tape 2 (i.e., when the double-sided tape 2 exhibits a behavior in which elastic deformation is dominant) in cleaving of the wafer 1, the wafer 1 is hard to be cleaved, leading to deterioration of a cleavage yield (that is, cleavage failure). In contrast, when a sufficient displacement is given to the double-sided tape 2 (i.e., when the double-sided tape 2 exhibits a behavior in which viscous deformation is dominant), the wafer 1 is easily cleaved, but the wafer 1 does not resist the warping force of the wafer 1, and thus cannot maintain a flat state. Thus, it is difficult to form the cleavage starting portion 11 at a predetermined depth in the step of forming the cleavage starting portion 11.

On the other hand, with the double-sided tape 2 having the loss tangent adapted to be increased by heating from an ordinary temperature, the cleavage starting portion 11 is easily formed at a predetermined depth because formation of the cleavage starting portion 11 is performed before the wafer is heated, and therefore the double-sided tape 2 has a small loss tangent (a behavior in which elastic deformation is dominant). Meanwhile, when cleaving of the wafer 1, heating causes the double-sided tape 2 to have a large loss tangent (a behavior in which viscous deformation is dominant), so that the wafer is easily cleaved.

In the present specification, the loss tangent refers to a value obtained by dividing a contribution of viscosity to the dynamic properties of a material by a contribution of elasticity to the dynamic properties of a material. More specifically, loss tangent=loss elastic modulus/storage elastic modulus, where the loss elastic modulus is an index of viscosity, and the storage elastic modulus is an index of elasticity. The loss tangent can be measured by a viscoelasticity measuring apparatus, such as DMS 6100 manufactured by Hitachi High-Tech Science Corporation. The loss tangent in this specification is a value determined at a frequency of 10 Hz using this apparatus.

Figure 6:
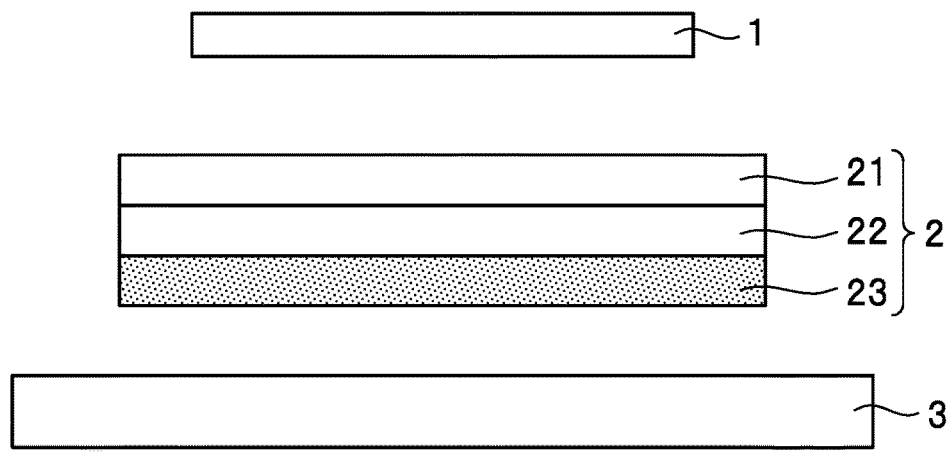
FIG. 6 is a schematic cross-sectional view showing a state of a double-sided tape to be used in an embodiment.

For the double-sided tape 2, any appropriate double-sided tape may be used as long as the loss tangent thereof is increased by heating from an ordinary temperature. However, as illustrated in FIG. 6, it is preferable that the double-sided tape 2 includes an acryl-based adhesive layer 21 formed on one surface of a base material film 22, and a heat-foaming agent-containing adhesive layer 23 formed on another surface of the base material film 22. In the double-sided tape 2, the acryl-based adhesive layer 21 is bonded to the wafer 1, and the heat-foaming agent-containing adhesive layer 23 is bonded to the support base member 3. The area of a surface of the double-sided tape 2 bonded to the wafer 1 is larger than the area of a surface of the wafer 1 bonded to the double-sided tape 2.

The acryl-based adhesive layer 21 is easily bonded to the semiconductor layer of the wafer 1, and has good impact resistance, water resistance, moisture resistance, and the like. The heat-foaming agent-containing adhesive layer 23 has good peeling resistance before heating (i.e., before foaming), and is easily peeled off after heating (i.e., after foaming). Accordingly, with the heat-foaming agent-containing adhesive layer 23, the wafer 1 is easily temporarily fixed to the support base member 3, and the light emitting element mounted tape 5 including a plurality of light emitting elements 4 and the double-sided tape 2 (see FIG. 3C) is easily peeled off from the support base member 3 after the wafer is divided.

For the double-sided tape 2, for example, Intelimer (registered trademark) Tape manufactured by NITTA Corporation can be used.

For the support base member 3, any appropriate material may be used, and examples thereof include stainless steel base members. A thickness of the support base member 3 is, for example, in a range of 0.1 to 2 mm.

In temporary fixation of the wafer 1 to the support base member 3, one adhesive surface of the double-sided tape 2 may be attached to the semiconductor layer of the wafer 1, followed by attaching the other adhesive surface of the double-sided tape 2 to the support base member 3; or the semiconductor layer of the wafer 1 may be attached to one adhesive surface of the double-sided tape 2 after the other adhesive surface of the double-sided tape 2 is attached to the support base member 3.

As used herein, the expression "temporary fixation" refers to that the light emitting element mounted tape 5 including a plurality of light emitting elements 4 and the double-sided tape 2 is fixed to the support base member 3 while being peelable from the support base member 3. The light emitting element mounted tape 5 is fixed to the support base member 3 in a state in which the light emitting element mounted tape 5 can be easily peeled from the support base member 3 after the wafer 1 is divided. The wafer 1 is also temporarily fixed to one adhesive surface of the double-sided tape 2 while being peelable from the double-sided tape 2.

Forming Cleavage Starting Portion

Figure 2A:
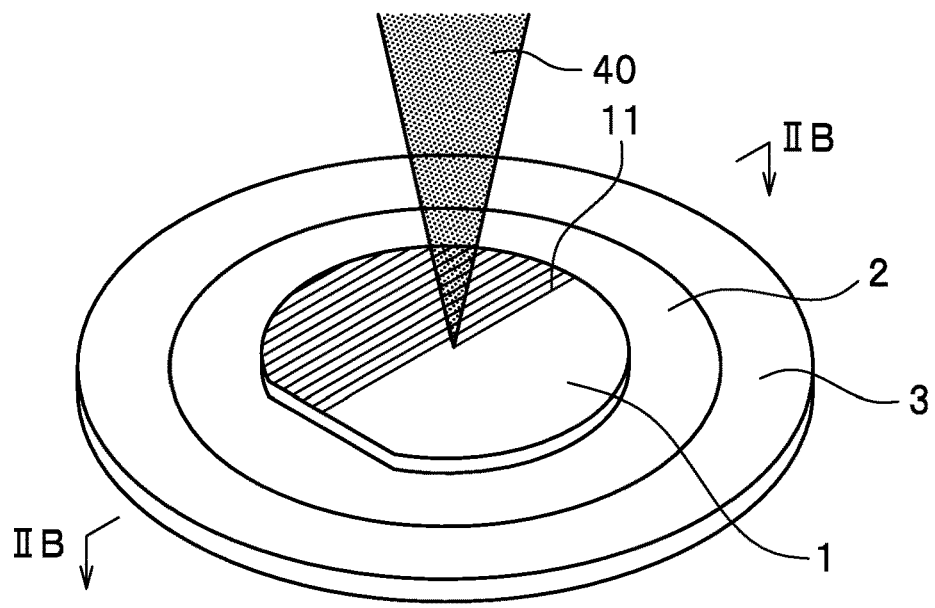
FIG. 2A is a schematic perspective view showing an operation of forming a cleavage starting portion in a wafer in a method of manufacturing a light emitting element according to an embodiment.
Figure 2B:
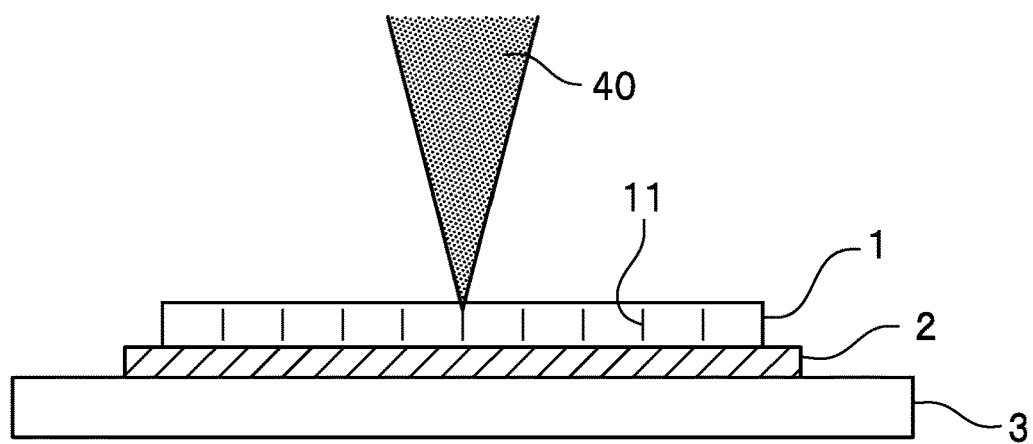
FIG. 2B is a schematic cross-sectional view showing an operation of forming a cleavage starting portion in a wafer in a method of manufacturing a light emitting element according to an embodiment, which corresponds to a cross-section taken along line IIB-IIB in FIG. 2A.

In the cleavage starting portion forming step S102, the cleavage starting portion 11 for dividing the wafer 1 into a plurality of light emitting elements 4 at an ordinary temperature is formed in the wafer 1, as shown in FIGS. 2A and 2B.

In the cleavage starting portion forming step S102, the cleavage starting portion 11 is formed at a temperature (first temperature) which does not cause an increase in loss tangent of the double-sided tape 2. Herein, the first temperature is ordinary temperature, e.g. 20° C., and may be in a range of 15° C. to 25° C. When the cleavage starting portion 11 is formed at the first temperature, the cleavage starting portion 11 is easily formed at a predetermined depth as described above. The specific value of the loss tangent is 0.2 or less.

The cleavage starting portion 11 can be formed in the wafer 1 by, for example, irradiating laser light 40 to the wafer 1 temporarily fixed to the support base member 3. In FIG. 2A, the cleavage starting portion 11 is shown by a continuous line on the upper surface of the wafer 1 for ease of understanding of the step of forming the cleavage starting portion 11. In FIG. 2B, the cleavage starting portion 11 is schematically shown as a line in the thickness direction for ease of understanding of the state of the cleavage starting portion 11.

More specifically, the support base member 3 to which the wafer 1 temporarily fixed is fixed to a vacuum suction table. Next, laser light 40 is irradiated from a base member side to be focused at the inside of the base member of the wafer at a portion where the wafer 1 is to be cleaved at the time of singulation into chips (i.e., cleavage region portion). This forms a modified portion (internally processed layer) in the base member. The modified portion is a cleavage groove extending in the thickness direction of the base member, i.e. in a direction substantially perpendicular to the main surface of the base member. By using laser light 40 in the cleavage starting portion forming step S102, the cleavage starting portion 11 can be easily formed.

For laser light 40, various lasers can be used such as lasers that generate pulse laser beams, and continuous wave lasers capable of causing multiphoton absorption. Among them, lasers that generate pulse laser beams such as femtosecond laser beams, picosecond laser beams and nanosecond laser beams are preferable. The laser light 40 may have any appropriate wavelength, and for example, Nd:YAG laser, Nd:YVO$_4$ laser, Nd:YLF laser and titanium sapphire laser can be for emitting the laser light 40.

In a conventional technique, a method is used in which a wafer is attached to a dicing sheet, the dicing sheet is fixed to a vacuum suction table, and a cleavage starting portion is formed in the wafer. In this method, the dicing sheet is tensioned, and accordingly, if breakage occurs along a cleavage groove in the wafer in formation of the cleavage starting portion, a portion in which breakage occurs (hereinafter, referred to as a "breakage portion") is easily extended. Further, the smaller thickness the base member is processed to have, the more greatly the wafer is warped, and thus the more easily the breakage portion is extended. Accordingly, positions of cleavage starting portions may be deviated from dicing position information acquired before the wafer is divided, so that a cleavage starting portion may be failed to be formed at a position where, and thus an electrode layer may be damaged. Moreover, at the time of stopping vacuum suction, the breakage portion is further extended, and this portion is opened (i.e., the width of the breakage portion increases). Further, in the step of dividing the wafer, failure to apply an appropriate load and displacement by a blade at a predetermined position leads to poor cleavage.

On the other hand, in this embodiment, the wafer 1 is temporarily fixed to the support base member 3, and therefore, even if breakage occurs in the wafer 1 in formation of the cleavage starting portion 11, opening of the breakage is not extended at the time of stopping vacuum suction. Thus, the wafer 1 is easily cleaved, and occurrence of defect as described above can be prevented.

Dividing Step

Figure 3A:
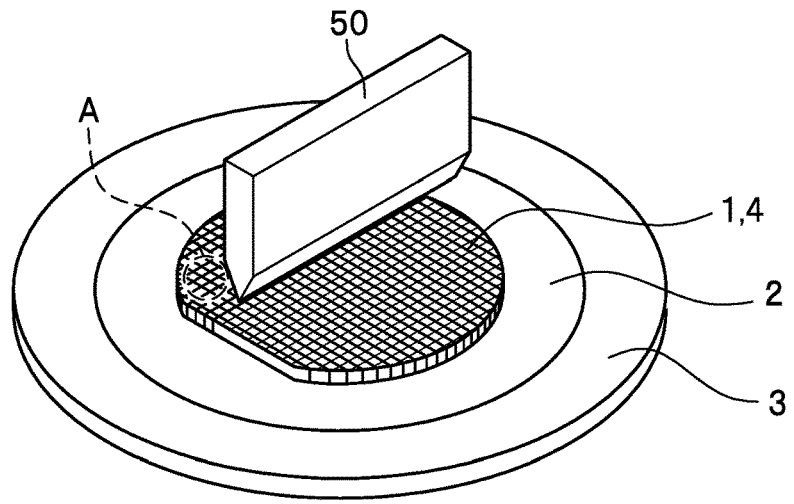
FIG. 3A is a schematic perspective view showing an operation of dividing a wafer in a method of manufacturing a light emitting element according to an embodiment.
Figure 3B:
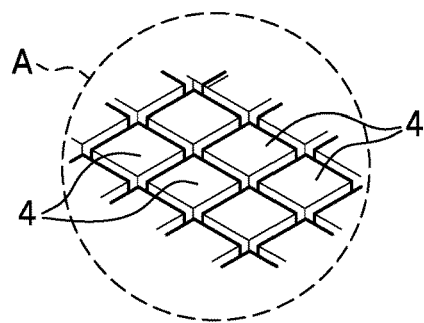
FIG. 3B is an enlarged schematic view of a part indicated by symbol A in FIG. 3A.

In the dividing step S103, as shown in FIGS. 3A and 3B, the wafer 1 is divided into a plurality of light emitting elements 4 on the support base member 3, while the double-bonded tape 2 is heated from an ordinary temperature.

In the dividing step S103, the wafer 1 is singulated into a plurality of light emitting elements 4 at a temperature at which loss tangent of the double-sided tape 2 is increased (i.e., second temperature). The second temperature is a temperature higher than the first temperature.

The second temperature is, for example, in a range of 40° C. to 80° C. In singulation of the wafer 1 at the second temperature, the double-sided tape 2 is brought into a state in which viscous deformation is dominant as described above, and therefore downward movement can be easily performed during cutting by a blade, so that impact from the cleavage blade is reduced to apply an appropriate force to the cleavage starting portion 11. Thus, extension of cracks is promoted to easily cleave the wafer 1.

Heating can be performed by, for example, mounting the support base member 3 with the wafer 1 temporarily fixed thereto on a plate having a heating mechanism, and heating the plate to transmit heat from the plate indirectly to the double-sided tape 2 through the support base member 3.

The wafer 1 is cleaved along the cleavage region portion to be divided into a shape of chips so as to obtain individual light emitting elements 4. The wafer 1 can be cleaved by, for example, scribing or dicing. FIG. 3A shows a state in which the wafer 1 is cleaved by dicing using a blade 50 as one example, where the cleavage starting portion 11 is shown as a continuous line on a part of the upper surface of the wafer 1 for convenience. The wafer 1 may be cleaved by a $CO_2$ laser.

Separating Support Base Member

Figure 3C:
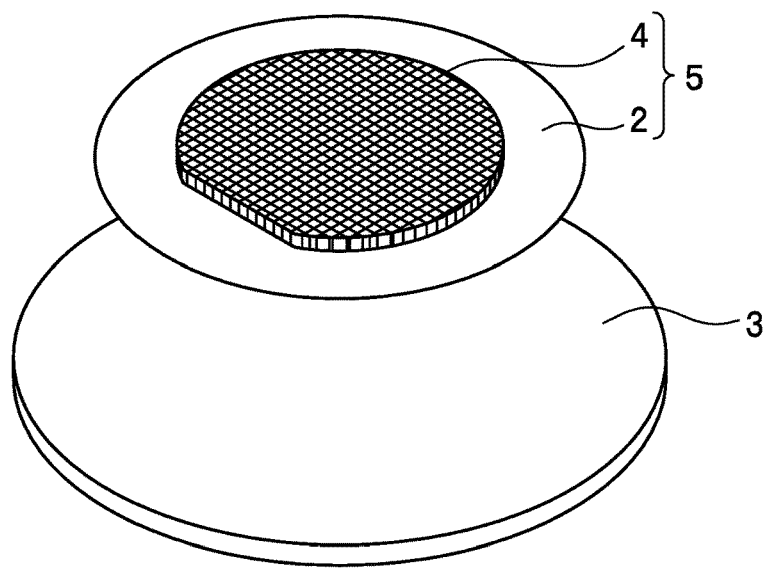
FIG. 3C is a schematic perspective view showing an operation of peeling off a light emitting element mounting tape, which includes a plurality of light emitting elements and a double-sided tape, from a support base member in a method of manufacturing a light emitting element according to an embodiment.

In the support base member separating step S104, the light emitting element mounting tape 5 including a plurality of light emitting elements 4 and the double-sided tape 2 is peeled off from the support base member 3, as shown in FIG. 3C.

With the light emitting element mounting tape 5 temporarily fixed to the support base member 3, the light emitting element mounting tape 5 can be easily separated from the support base member 3 in the support base member separating step S104. With the double-sided tape 2 in which the heat-foaming agent-containing adhesive layer 23 is bonded to the support base member 3 as described above, the light emitting element mounting tape 5 is easily peeled off from the support base member 3 in the support base member separating step S104 after the double-sided tape 2 is heated.

Peeling Off Light Emitting Element

In the light emitting element peeling step S105, a plurality of light emitting elements 4 are peeled off from the double-sided tape 2.

Figure 4A:
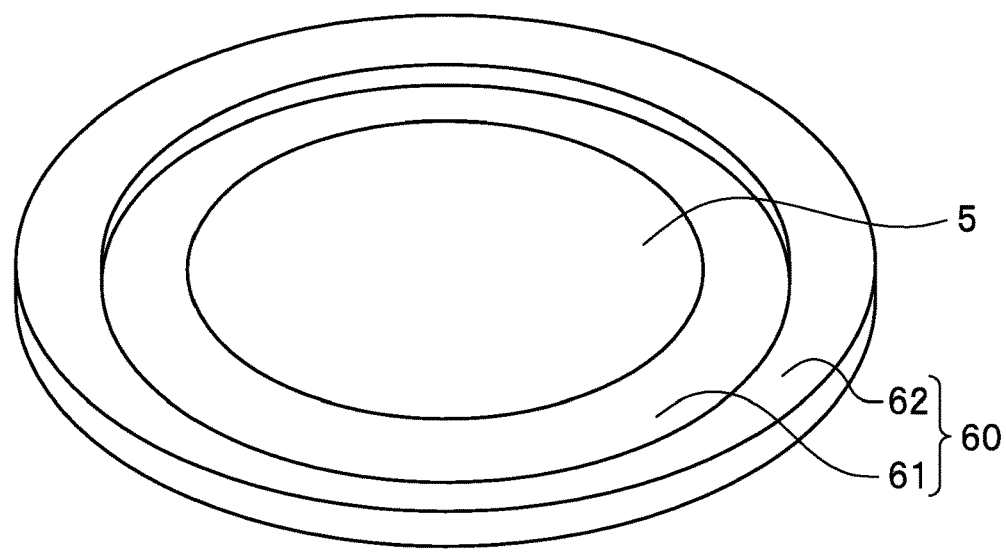
FIG. 4A is a schematic perspective view showing an operation of re-applying a light emitting element mounting tape to an inspection and/or classification process sheet in an operation of peeling off a plurality of light emitting elements from a double-sided tape in a method of manufacturing a light emitting element according to an embodiment.
Figure 4B:
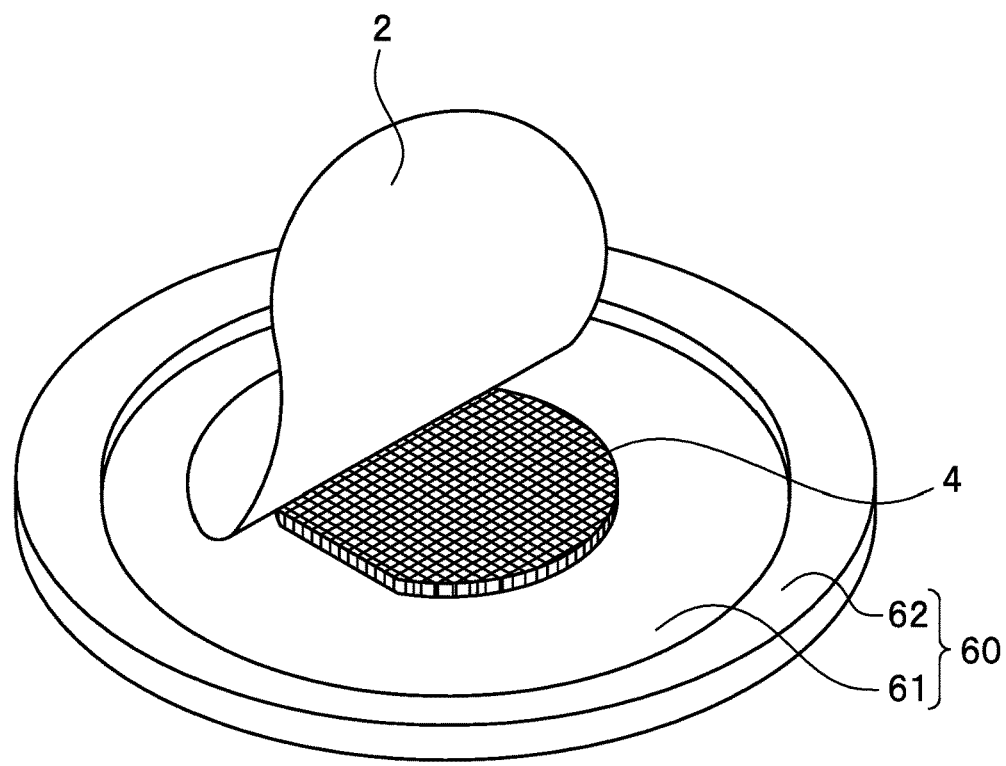
FIG. 4B is a schematic perspective view showing an operation of peeling off a plurality of light emitting elements from a double-sided tape in a method of manufacturing a light emitting element according to an embodiment.
Figure 5:
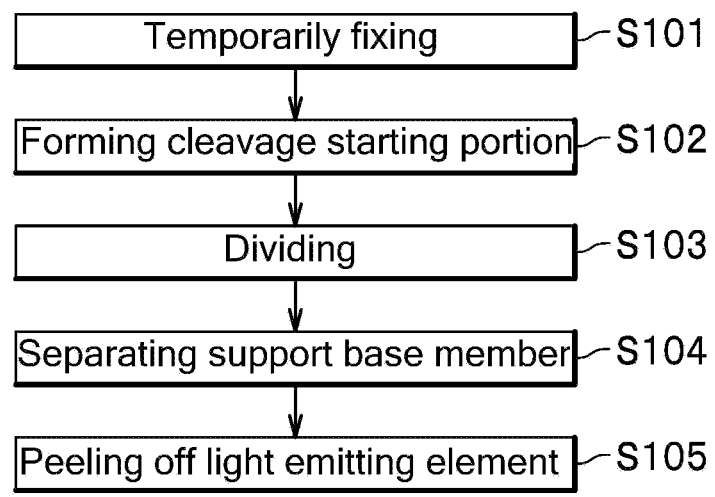
FIG. 5 is a flow chart showing a flow of a method of manufacturing a light emitting element according to a first embodiment.

In the light emitting element peeling step S105, the light emitting element mounting tape 5 peeled off from the support base member 3 is re-applied to a sheet 60 for inspection and/or classification as shown in FIG. 4A. At this time, the light emitting elements 4 are temporarily fixed to the sheet 60 for inspection and/or classification. Next, as shown in FIG. 4B, the double-sided tape 2 is peeled off, and thus a plurality of light emitting elements 4 are peeled off from the double-sided tape 2.

The sheet 60 for inspection and/or classification includes an adhesive layer 61 provided on a base material, and a frame 62 provided on the periphery of the adhesive layer 61.

The sheet 60 for inspection and/or classification to which a plurality of light emitting elements 4 is temporarily fixed is sent to a next step, where defective light emitting elements 4 are selected, and removed.

The method of manufacturing a light emitting element may include grinding the base member of the wafer 1. Hereinafter, a second embodiment will be described.

Second Embodiment

Figure 7:
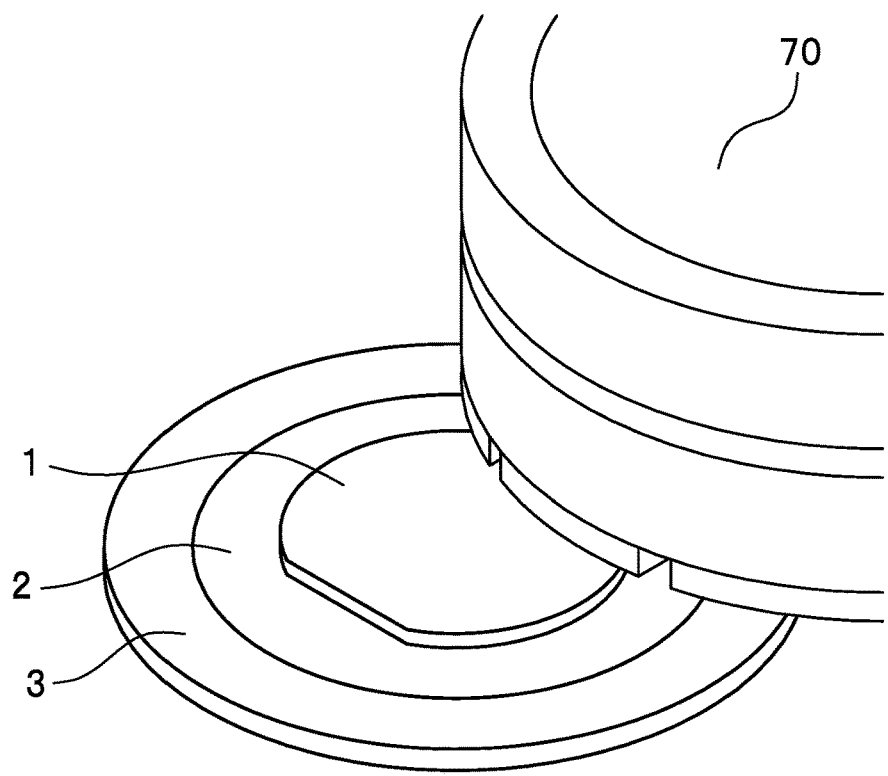
FIG. 7 is a schematic perspective view showing an operation of reducing a thickness of a base member of a wafer by grinding in a method of manufacturing a light emitting element according to an embodiment.
Figure 8:
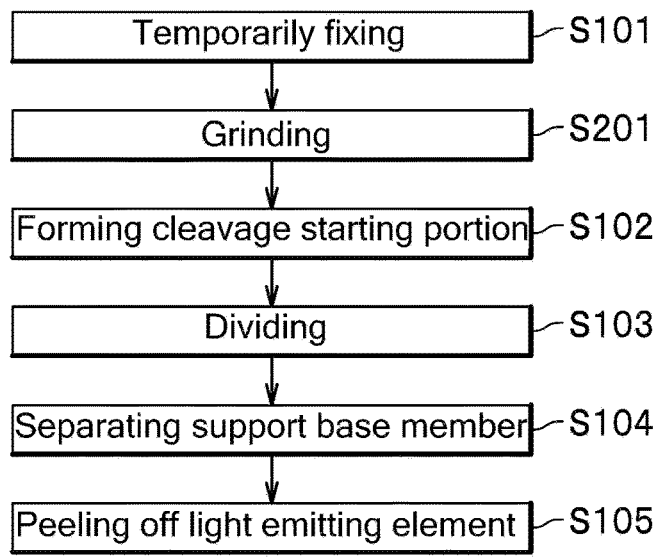
FIG. 8 is a flow chart showing a flow of a method of manufacturing a light emitting element according to a second embodiment.

The second embodiment includes a step of thinning a base member of a wafer 1 (grinding step S201) after a temporarily fixing step S101 and before a cleavage starting portion forming step S102, as shown in FIGS. 7 and 8. The base member can be ground using a grinder 70. A step of polishing the base member can be further carried out after grinding.

By grinding the base member, a thickness of the base member can be reduced, and therefore the wafer 1 is easily cleaved.

In a conventional technique, a wafer is attached to a dicing sheet, the dicing sheet is fixed to a vacuum suction table, and grinding and polishing is performed. In this method, however, a large processing load is applied, so that the wafer is easily deformed, and therefore when the base member is thinned, breakage easily occurs. If breakage occurs in the wafer in grinding and/or polishing, a portion in which breakage occurs (i.e., breakage portion) is extended at the time of stopping vacuum suction, and this portion is opened (i.e., the width of the breakage portion increases). Accordingly, it is necessary to re-apply the wafer to a new dicing sheet. Further, at this time, dividing of a wafer is required, which may need to discard many parts of the wafer.

On the other hand, in this embodiment, the wafer 1 is temporarily fixed to a support base member 3, and thus the wafer 1 is firmly fixed to the support base member 3. Thus, even when a thickness of the base member is reduced, breakage hardly occurs. If breakage occurs in the wafer 1 in grinding and/or polishing, a breakage opening is not extended at the time of stopping vacuum suction. The wafer 1 in which breakage occurs can be sent directly to a next step, and therefore a step of treating the broken wafer 1 can be simplified, so that mass productivity is improved. Further, only light emitting elements 4 that become defective due to breakage may be removed, and therefore the discarded area of the wafer 1 is reduced, so that the yield can be improved.

Examples of a conventional technique further includes a method in which a wafer is fixed to a base with a wax-like adhesive, a base member is ground and polished, and the wafer is then peeled off from the base. In this method, however, it is difficult to favorably grind and/or polish a thick wafer, and it is difficult to perform mirror-polishing of the wafer.

On the other hand, in the present embodiment, the wafer 1 is temporarily fixed to the support base member 3, so that the thick wafer 1 can be favorably ground and/or polished, and mirror-polishing of the wafer 1 is easily performed, leading to improvement of mass productivity.

In the grinding step S201, the base member of the wafer 1 is preferably ground while cooling the double-sided tape 2.

In a conventional technique using a dicing sheet, the temperature of the dicing sheet is elevated due to influences of processing heat in grinding, so that the loss tangent is increased. Thus, it is difficult to reduce a thickness of a base member without causing breakage of a wafer. On the other hand, in this embodiment, the base member is ground while the double-sided tape 2 is cooled, so that the loss tangent of the double-sided tape 2 is not increased. Thus, the double-sided tape 2 has a hardness suitable for grinding, and therefore grinding is easily ground stably, so that occurrence of breakage of the wafer 1 can be reduced.

The cooling temperature is, for example, 0 to 15° C.

The double-sided tape 2 can be cooled by, for example, connecting the support base member 3 to a cooling mechanism configured to generate cold air, or spraying cold air from the cooling mechanism to the support base member 3 to cool the support base member 3. By cooling the support base member 3 in this manner, cold air from the support base member 3 can be transmitted indirectly to the double-sided tape 2 through the support base member 3 to cool the double-sided tape 2.

Alternatively, for example, using a vacuum suction table having a cooling mechanism, coldness is transmitted from the vacuum suction table indirectly to the double-sided tape 2 through the support base member 3 to cool the double-sided tape 2.

Another Embodiment

Figure 9:
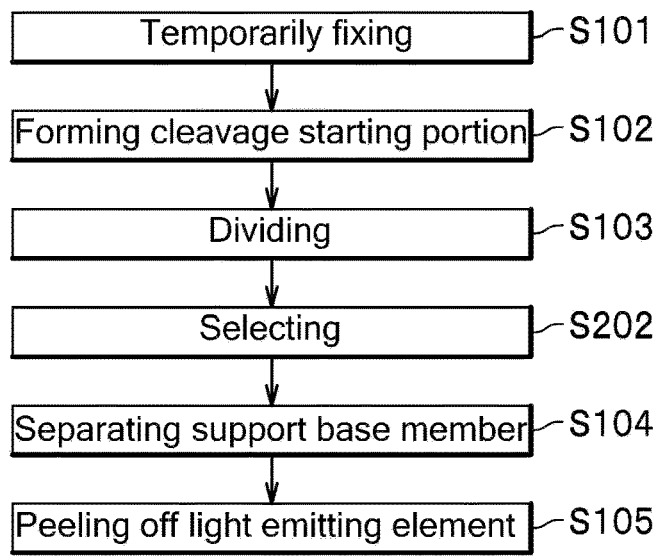
FIG. 9 is a flow chart showing a flow of a method of manufacturing a light emitting element according to another embodiment.

In the first and second embodiments as described above, the wafer 1 is singulated into a plurality of light emitting elements 4, the light emitting element mounting tape 5 is then peeled off from the support base member 3, and re-applied to the sheet 60 for inspection and/or classification, and defective light emitting elements 4 are then selected and removed. However, a step of selecting defective light emitting elements 4 may be carried out on the support base member 3. That is, as shown in FIG. 9, a selection step S202 may be carried out after the dividing step S103 and before the support base member separating step S104.

In the selection step S202, defective light emitting elements 4 are selected on the support base member 3 to identify defective light emitting elements 4. Then, after peeling off the light emitting element mounting tape 5 from the support base member 3, defective light emitting elements 4 that has been selected and identified is prevented from being used, which results in removal of defective light emitting elements 4. Thus, it is unnecessary to re-apply the light emitting element mounting tape 5 to the sheet 60 for inspection and/or classification, so that the manufacturing steps can be simplified. Defective light emitting elements 4 can be selected by the same method as in a known technique, for example by image processing on images of light emitting elements 4, or visual inspection.

The method of manufacturing a light emitting element may further include other steps during or before or after the above-described steps as long as the above-described steps are not adversely affected. For example, the method may further include a contaminant removing step of removing contaminants mixed during manufacturing.

As described above, the method of manufacturing a light emitting element according to this embodiment can exhibit good work efficiency.

Further, in a conventional technique in which a wafer is attached to a dicing sheet, if breakage occurs in the wafer with a great warpage during manufacturing, a breakage portion is easily extended. Extension of the breakage portion may cause various problems as described above. More specifically, re-application of the wafer may be required, the discarded area of the wafer may be increased, or defects such as scratching of a die edge and chipping of a blade may occur at the time of dividing the wafer. In addition, when the breakage portion is extended before formation of a cleavage starting portion on the wafer, it may be unable to form the cleavage starting portion. In particular, in a wafer subjected to a CMP (chemical mechanical polishing) treatment or a deposition treatment, warpage tends to be increased, so that a breakage portion is easily extended.

On the other hand, in this embodiment, the wafer is temporarily fixed to the support base member, and therefore even if breakage occurs in the wafer, a breakage portion is not extended, and thus the problems as described above do not arise.

In the method of manufacturing a light emitting element according to this embodiment, the double-sided tape is attached to the support base member, so that stable heating and cooling of the double-sided tape via the support base member can be facilitated.

A light emitting element manufactured using a method of manufacturing a light emitting element according to an embodiment of the present disclosure can be used for various light sources such as backlight light sources of liquid crystal display devices, various kinds of lighting equipment and large display devices.

DENOTATION OF REFERENCE NUMERALS

1 Wafer
2 Double-sided tape
3 Support base member
4 Light emitting element
5 Light emitting element mounting tape
11 Cleavage starting portion
21 Acryl-based adhesive layer
22 Base material film
23 Heat-foaming agent-containing adhesive layer
40 Laser light
50 Blade
60 Sheet for inspection and/or classification
61 adhesive layer
62 Frame
70 Grinder
A Part of cleaved wafer

What is claimed is:

1. A method of manufacturing a light emitting element, the method comprising:
   temporarily fixing a semiconductor layer of a wafer including a base member and the semiconductor layer to a support base member by a double-sided tape having a loss tangent adapted to be increased by heating from an ordinary temperature;
   forming a cleavage starting portion for dividing the wafer into a plurality of light emitting elements at an ordinary temperature in the wafer; and
   singulating the wafer into a plurality of light emitting elements on the support base member while the double-sided tape is heated.

2. The method of manufacturing a light emitting element according to claim 1, the method further comprising reducing a thickness of the base member by grinding after the step of temporarily fixing the wafer to the support base member and before the step of forming the cleavage starting portion on the wafer.

3. The method of manufacturing a light emitting element according to claim 2, wherein, in the step of reducing the thickness of the base member, the base member is ground while cooling the double-sided tape.

4. The method of manufacturing a light emitting element according to claim 1, wherein in the step of forming the cleavage starting portion on the wafer, the wafer temporarily fixed to the support base member is irradiated with laser light to form the cleavage starting portion in the wafer.

5. The method of manufacturing a light emitting element according to claim 2, wherein in the step of forming the cleavage starting portion on the wafer, the wafer temporarily fixed to the support base member is irradiated with laser light to form the cleavage starting portion in the wafer.

6. The method of manufacturing a light emitting element according to claim 3, wherein in the step of forming the cleavage starting portion on the wafer, the wafer temporarily fixed to the support base member is irradiated with laser light to form the cleavage starting portion in the wafer.

7. The method of manufacturing a light emitting element according to claim 1, the method further comprising:
   peeling off the plurality of light emitting elements and the double-sided tape from the support base member after the step of singulating the wafer into the plurality of light emitting elements; and
   peeling off the plurality of light emitting elements from the double-side tape after the step of peeling off the plurality of light emitting elements and the double-sided tape from the support base member.

8. The method of manufacturing a light emitting element according to claim 2, the method further comprising:
   peeling off the plurality of light emitting elements and the double-sided tape from the support base member after the step of singulating the wafer into the plurality of light emitting elements; and
   peeling off the plurality of light emitting elements from the double-side tape after the step of peeling off the plurality of light emitting elements and the double-sided tape from the support base member.

9. The method of manufacturing a light emitting element according to claim 4, the method further comprising:
   peeling off the plurality of light emitting elements and the double-sided tape from the support base member after the step of singulating the wafer into the plurality of light emitting elements; and
   peeling off the plurality of light emitting elements from the double-side tape after the step of peeling off the plurality of light emitting elements and the double-sided tape from the support base member.

10. The method of manufacturing a light emitting element according to claim 5, the method further comprising:
    peeling off the plurality of light emitting elements and the double-sided tape from the support base member after the step of singulating the wafer into the plurality of light emitting elements; and
    peeling off the plurality of light emitting elements from the double-side tape after the step of peeling off the plurality of light emitting elements and the double-sided tape from the support base member.

11. The method of manufacturing a light emitting element according to claim 6, the method further comprising:
    peeling off the plurality of light emitting elements and the double-sided tape from the support base member after the step of singulating the wafer into the plurality of light emitting elements; and
    peeling off the plurality of light emitting elements from the double-side tape after the step of peeling off the plurality of light emitting elements and the double-sided tape from the support base member.

12. The method of manufacturing a light emitting element according to claim 7, the method further comprising selecting defective light emitting elements among the singulated wafer on the support base member after the step of dividing the wafer into the plurality of light emitting elements and before the step of peeling off the plurality of light emitting elements and the double-sided tape from the support base member.

13. The method of manufacturing a light emitting element according to claim 8, the method further comprising selecting defective light emitting elements among the singulated wafer on the support base member after the step of dividing the wafer into the plurality of light emitting elements and before the step of peeling off the plurality of light emitting elements and the double-sided tape from the support base member.

14. The method of manufacturing a light emitting element according to claim 9, the method further comprising selecting defective light emitting elements among the singulated wafer on the support base member after the step of dividing the wafer into the plurality of light emitting elements and before the step of peeling off the plurality of light emitting elements and the double-sided tape from the support base member.

15. The method of manufacturing a light emitting element according to claim 10, the method further comprising selecting defective light emitting elements among the singulated wafer on the support base member after the step of dividing the wafer into the plurality of light emitting elements and before the step of peeling off the plurality of light emitting elements and the double-sided tape from the support base member.

16. The method of manufacturing a light emitting element according to claim 1, wherein the loss tangent is 0.3 or more in the step of dividing the wafer into a plurality of light emitting elements on the support base member.

17. The method of manufacturing a light emitting element according to claim 2, wherein the loss tangent is 0.3 or more in the step of dividing the wafer into a plurality of light emitting elements on the support base member.

18. The method of manufacturing a light emitting element according to claim 4, wherein the loss tangent is 0.3 or more in the step of dividing the wafer into a plurality of light emitting elements on the support base member.

19. The method of manufacturing a light emitting element according to claim 7, wherein the loss tangent is 0.3 or more in the step of dividing the wafer into a plurality of light emitting elements on the support base member.

20. The method of manufacturing a light emitting element according to claim 12, wherein the loss tangent is 0.3 or more in the step of dividing the wafer into a plurality of light emitting elements on the support base member.

* * * * *